United States Patent [19]

Asoh

[11] Patent Number: 5,025,418
[45] Date of Patent: Jun. 18, 1991

[54] SEMICONDUCTOR DEVICE FOR PERFORMING AUTOMATIC REPLACEMENT OF DEFECTIVE CELLS

[75] Inventor: Syoichi Asoh, Oita, Japan

[73] Assignee: Kabushiki Kaisha Toshiba, Kawasaki, Japan

[21] Appl. No.: 468,880

[22] Filed: Jan. 23, 1990

[30] Foreign Application Priority Data

Feb. 2, 1989 [JP] Japan .................................. 1-24548

[51] Int. Cl.$^5$ ................................................ G11C 8/00
[52] U.S. Cl. .................................... 365/200; 371/10.2
[58] Field of Search ............... 365/200; 371/10.2, 10.3

[56] References Cited

U.S. PATENT DOCUMENTS 4,691,301 9/1987 Anderson ............................ 365/200

Primary Examiner—James W. Moffitt
Attorney, Agent, or Firm—Finnegan, Henderson, Farabow, Garrett and Dunner

[57] ABSTRACT

A semiconductor device includes a main storage section for storing data. A spare storage section is disposed in association with the main storage section so as to serve as a redundancy circuit for replacing a deflection element of the main storage section. A temporary storage section is disposed in association with the main storage section to store the data temporarily. A comparator section makes a comparison between the data stored in the main storage section and the data stored in the temporary storage section to provide a comparison result. A switching section is responsive to the comparison result output from the comparator section to replace the defective element with the spare storage section.

8 Claims, 3 Drawing Sheets

SEMICONDUCTOR DEVICE FOR PERFORMING AUTOMATIC REPLACEMENT OF DEFECTIVE CELLS

BACKGROUND OF THE INVENTION

1. Field of the Invention

The present invention relates to a semiconductor device and, more particularly, to a semiconductor device for detecting defective memory elements and automatically replacing them with redundant memory elements.

2. Description of the Related Art

Heretofore, to detect defective memory elements in a memory, data written into and read from the memory is examined by the use of an external tester. For remedying memories, that is, for replacing defective memory elements with redundant memory elements, connections to the defective memory elements are disconnected by electrical means or laser irradiation, the contents of the defective memory elements are stored by a spare memory section, or an address comparison with inspecting elements is made to detect defective memory elements, such as word lines, bit lines or defective decoders.

On the other hand, a redundant circuit involved in a memory is reduced in size as the integration density in semiconductor devices increases. Under such a situation, the remedy for memories by means of disconnection of wiring becomes increasingly difficult because of a decrease in reliability due to the disconnection of elements in multilevel interconnection structures of semiconductor devices, limitations on the reduction of the spot of a laser beam used for disconnection of wiring, and limitations on positioning accuracy due to the influence of passivation films of semiconductor devices.

SUMMARY OF THE INVENTION

It is accordingly an object of the present invention to provide a semiconductor device which allows defective elements to be automatically replaced without the use of conventional methods involving disconnection of wiring.

According to the present invention there is provided a semiconductor device comprising main storage means for storing data, spare storage means disposed in association with the main storage means so as to serve as a redundancy circuit for replacing defective element of the main storage means, temporary storage means disposed in association with the main storage means to store the data temporarily, comparing means for comparing the data stored in the main storage means with the data stored in the temporary storage means to output a comparison result, and shift register means coupled to the main storage means and the spare storage means and responsive to the comparison result output from the comparing means for replacing the defective element of the main storage means with the spare storage means.

BRIEF DESCRIPTION OF THE DRAWINGS

The foregoing aspects and other features of the invention will be explained in the following description in connection with the accompanying drawings in which.

DETAILED DESCRIPTION OF THE PREFERRED EMBODIMENT

Figure 1:
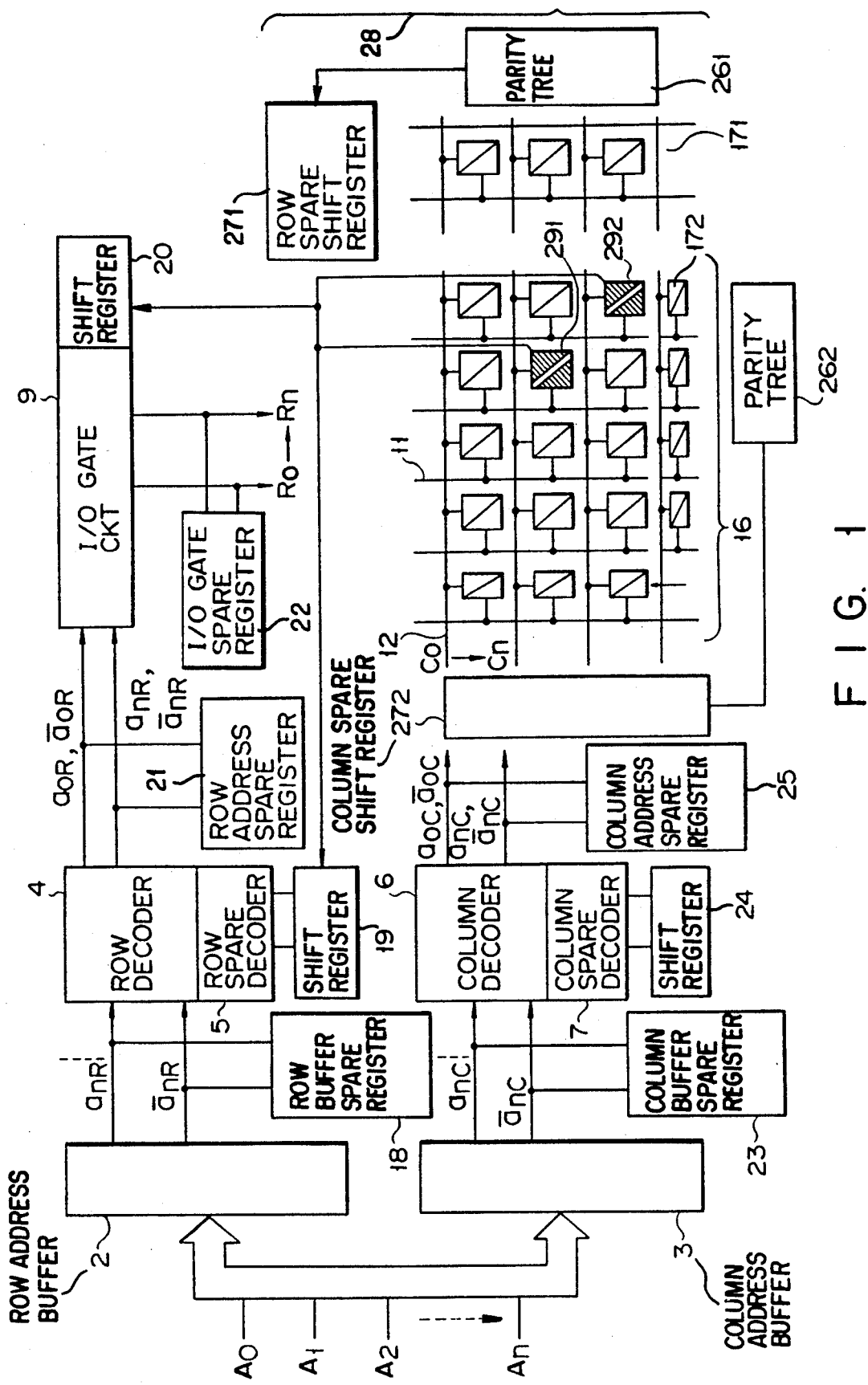
FIG. 1 illustrates a circuit arrangement of a semiconductor device according to an embodiment of the present invention.

Referring now to FIG. 1, a row buffer spare register 18 detects combinations of specific outputs, i.e., anR and $\overline{anR}$ of a row address buffer 2 to replace part of row decoder 4 with a row spare decoder 5. Reference numerals 19 and 20 denote switch circuits each formed of a shift register, 21 a row address spare register, and 22 an I/O gate spare register. Switch circuit 20 switches over from an I/O gate circuit 9 to spar register 22 when the contents of row address spare register 21 differ from the outputs of row decoder 4. Reference numeral 23 denotes a column buffer spare register, 24 a switch circuit formed of a shift register and 25 a column address spare register. Further, reference numeral 3 denotes a column address buffer. The circuit arrangement associated with columns corresponds to the circuit arrangement associated with rows described above.

Outputs RO to Rn of I/O gate circuit 9 correspond to word lines 11 (11O to 11n), respectively, and outputs of column decoder 6 correspond to bit lines CO to Cn, respectively. Reference numerals 17 and 172 denote temporary storage elements adapted for comparison, 261 and 262 parity trees, 271 a row spare shift register, 272 a column spare shift register, 28 a shift register comprised of the row spare shift register 271 and the parity tree 261, and 291 and 292 spare main storage cells.

Figure 3:
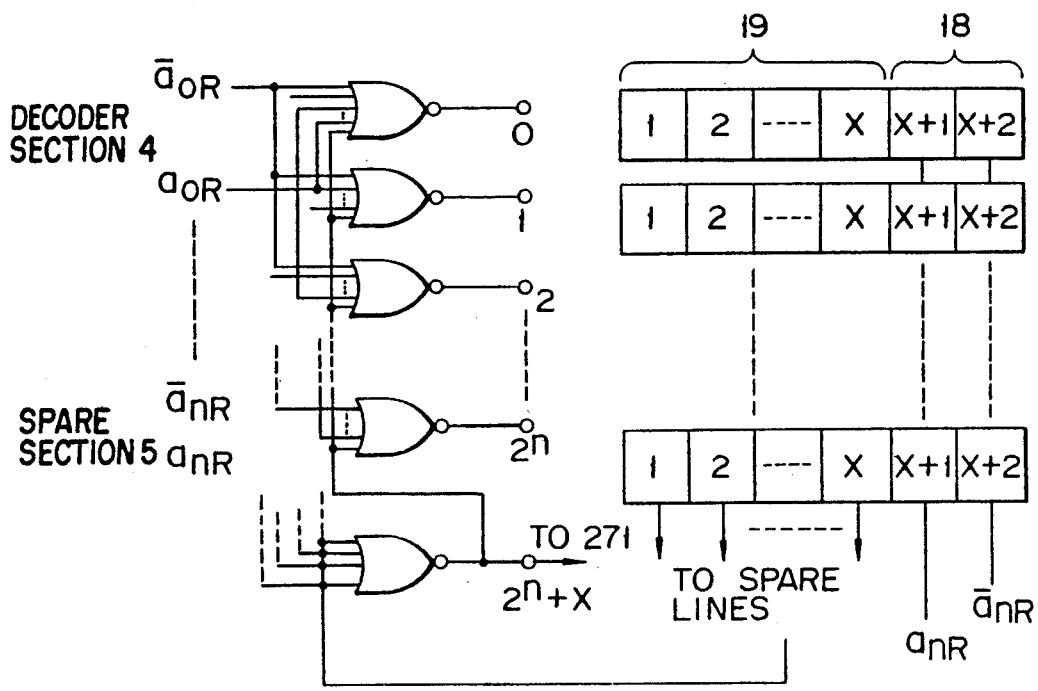
FIG. 3 illustrates a detailed circuit arrangement of the decoder section of FIG. 1.
Figure 5:
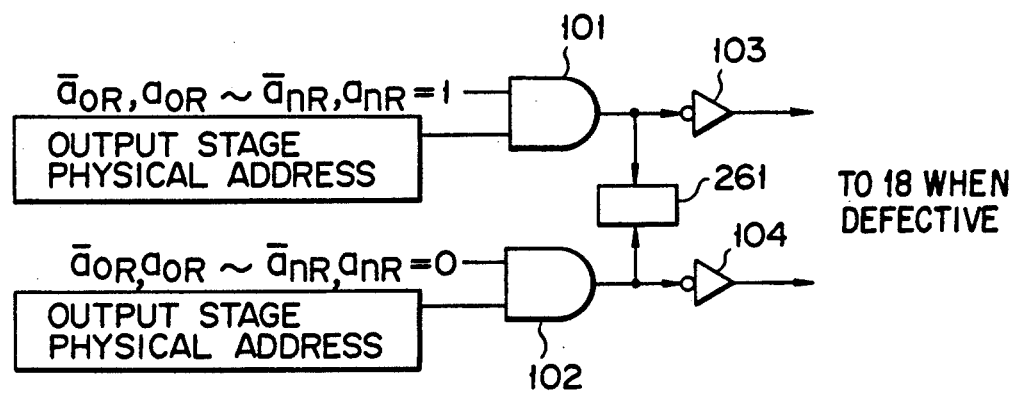
FIG. 5 shows a circuit for producing physical addresses for spare storage elements.

Decoder 4 will be described in detail with reference to FIG. 3. The input stage of decoder 4 is comprised of n+1 NOR circuits whose outputs correspond to the word lines of memory cell array (main storage section) 16 of FIG. 1. Signals split into aOR, $\overline{aOR}$–anR, $\overline{anR}$ by row address buffer 2 are split into physical address signals by row decoder 4. Among them n bits and bits to be checked in shift register 19 are used in spare circuit 271. The front stage of spare register 18 is shown in FIG. 5.

The operation of the semiconductor device of the present invention having such a circuit arrangement as described above will be described below.

Figure 2:
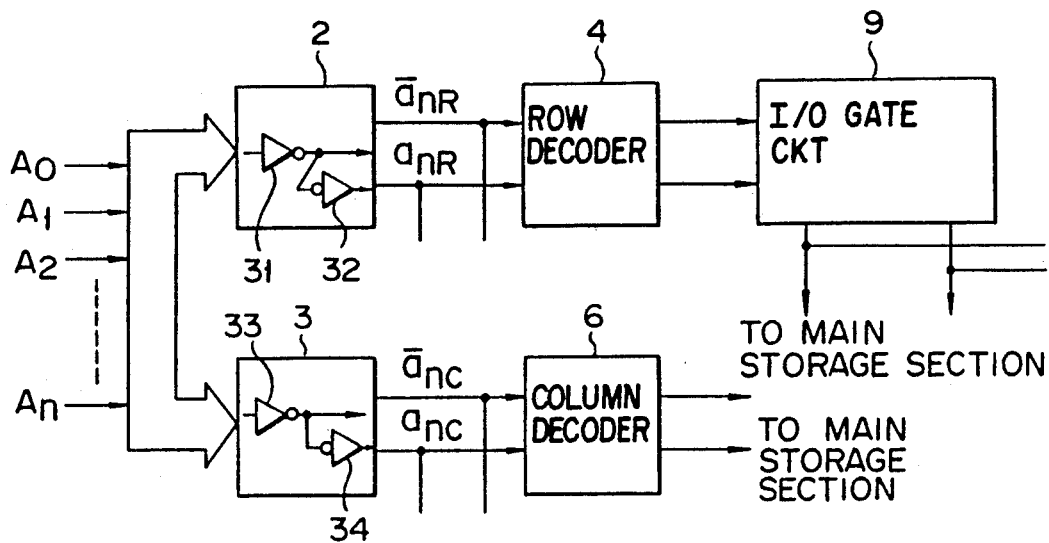
FIG. 2 illustrates a detailed circuit arrangement of the address buffer of FIG. 1.

First suppose that predetermined check data is previously written into a cell to be checked in main storage section 16. In this case, predetermined address input signals AO to An are split into row address signals and column address signals for application to row address buffer 2 and column address buffer 3. As shown in FIG. 2, row address buffer 2 comprises inverters 31 and 32 for inverting input signals, while column address buffer 3 comprises inverters 33 and 34 for inverting input signals. The row address signals are split by the inverters 31 and 32 to provide signals anR and $\overline{anR}$. The signals anR and $\overline{anR}$ are applied to row decoder 4 and row buffer spare register 18. Logical row addresses are output from row decoder 4. At this time, switch circuit 19 is switched and these logical row address data are written into word lines RO to Rn of main storage section 16.

At the same time, the same predetermined check data is written into temporary storage sectional 171.

Suppose that the above addresses AO to An are designated when the predetermined data is read out as read data. The read data is compared with the predetermined check data in temporary storage section 171 using parity tree 261 to determine whether a coincidence occurs. When no coincidence occurs, a determination is made that main storage section 16 has a defective cell or cells. The data read out of main storage section 16 is temporarily stored in shift register 28.

After that, the data is moved to row spare shift register 271 and the defective cells are replaced with spare storage cells 291 and 292. Spare storage cells are arranged at random.

Figure 6:
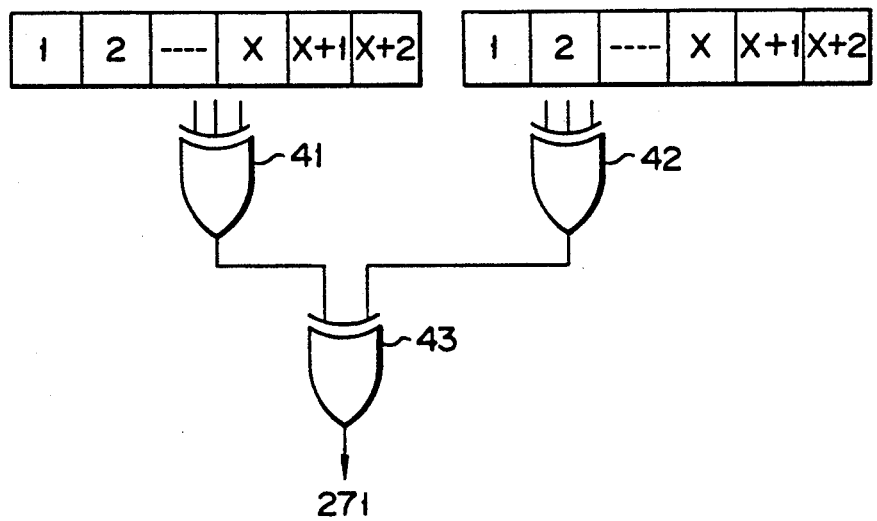
FIG. 6 shows a detailed circuit arrangement of a parity tree.

FIG. 6 shows a detailed circuit arrangement of parity tree 261. Inputs 1 to X+2 of EXCLUSIVE OR circuits 41 and 42 correspond to the bit lines of main storage section 16 and word lines of temporary storage section 171. The inputs x+1 and x+2 correspond to bit lines of spare storage cells 291 and 292. By examining the output of an EXCLUSIVE OR circuit 43 which receives the outputs of EXCLUSIVE OR circuits 41 and 42, a determination can be made as to whether or not a coincidence occurs between the data of main storage section 16 and the data of temporary storage section 171. Further, in the case where outputs of column decoder 6, which is provided to bit lines CO to Cn, are erroneous and no coincidence occurs between the data of main storage section 16 and the data of temporary storage section 171, an ON signal for switching is supplied to shift register 19 so as to replace the output data with row spare decoder 5 (see FIG. 3). Signals anR and $\overline{anR}$ stored in row buffer spare register 18 and signal anR of spare decoder 5 are compared at parity tree 261 so as to determine whether the ON signal is correct. When no coincidence is made, output signals from inverters 103 and 104 shown in FIG. 5 are supplied to row buffer spare register 18 so as to convert the address of spare register 18. As a result of the comparison between the data of main storage section 16 and the data of temporary storage section 171, when no coincidence occurs therebetween it follows that a defective cell or cells exist in main storage section 16. When a coincidence occurs as a result of the comparison, the contents of register 19 are cleared. When no coincidence occurs, the output of EXCLUSIVE OR circuit 43 is stored in row spare shift register 271. As a result, when a cell in which predetermined check data has been stored is defective, switching is made from the defective cell to spare storage cell 291 or 292. In this case, the switching is carried out using row spare decoder 5, switch circuits 19 and 20 formed of shift registers, row address spare register 21 and I/O gate spare register 22. The same applies to row address spare register 21. Output signals from row decoder 4 are stored in row address spare register 21 and when no coincidence is made, switch circuit 20 is used to switch to I/O gate spare register 22.

On the other hand, address check and switching for the column is the same as those for the row except that the row circuit includes I/O gate 9 additionally. That is, column address buffer 3, which is formed of inverters 33 and 34 as described above, provides signals anC and $\overline{anC}$. The signals anC and $\overline{anC}$ are applied to column buffer spare register 23 and column decoder 6. Column decoder 6 provides logical column addresses. By switching switch circuit 24, the above signals are distributed to main storage section 16 and temporary storage section 172 as logical column address signals. In this way predetermined check data is written into main storage section 16 from CO to Cn and temporary storage section 172.

Suppose that the addresses AO ... An are designated at a time of readout of the above data. The read data is compared with data in temporary storage section 172 by parity tree 262 to determine whether or not they coincide with each other. When no coincidence occurs, a determination is made that a defective cell or cells exist in main storage section 16. The data in parity tree 262 is thus stored in column spare shift register 272. When the cell in which the predetermined check data is stored is defective, switching is made from the defective cell to predetermined spare storage cell.

The check for defective cells is performed as described above. Furthermore, a check must be made on the addresses in order to determine whether spare storage cells can correctly be addressed for writing data thereinto or reading data therefrom.

Figure 4:
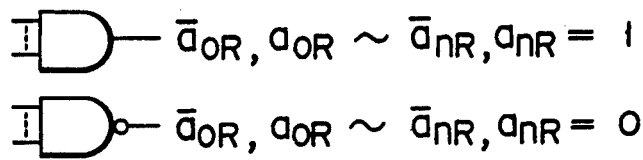
FIG. 4 illustrates a circuit for producing signals having logic levels "1" and "0"

In that case, addresses themselves are previously stored in main storage section 16 and temporary storage section 171 adapted for comparison. In checking, such a circuit as shown in FIG. 5 is used. The circuit includes two AND circuits 101 and 102 the outputs of which are connected to inverters 103 and 104, respectively. An input of AND circuit 101 is supplied with a signal of aOR, $\overline{aOR}$-anR, $\overline{anR}$=1 produced by a circuit shown in FIG. 4A, while the other input thereof is supplied with an output stage physical address of spare storage element 291. Similarly, AND circuit 102 has an input supplied with a signal of aOR, $\overline{aOR}$-anR, $\overline{anR}$ produced by the circuit shown in FIG. 4A and the other input supplied with an output stage physical address of spare storage element 292. Those physical addresses correspond to X+1 and X+2, respectively, of row buffer spare register 18 of FIG. 3. The outputs of AND circuits 101 and 102 are applied to parity check tree 261 for comparison. When no coincidence occurs, the outputs of inverters 103 and 104 are supplied to row buffer spare register 18. Spare register 18 selects row spare decoder 5 to replace part of row decoder 4 with row spare decoder 5. In this case, a switch-on signal to a spare line is first applied to switch circuit 19. A determination as to whether the switch-on signal is correct or not is made as follows. That is, a determination is made by parity tree 261 as to whether or not a coincidence occurs between the signals anR and $\overline{anR}$ stored in row buffer spare register 18 and the signal anR stored in spare section (row spare register) 5. When no coincidence occurs, the outputs of inverters 103 and 104 are supplied to row buffer spare register 18 with the result that part of row decoder 4 is replaced with row spare decoder 5.

As a result, the restoration of the address is performed so that spare storage element 291 or 292 corresponding to decoder 5 may be selected by row decoder 4. Incidentally, when a coincidence occurs between the above outputs, row buffer spare register 18 does not operate.

After switching is made to the spare corresponding to column spare decoder 7, the same is repeated for I/O gate 9. That is, a comparison is made by the parity tree between the contents of I/O gate 9 and the contents of I/O gate spare register 22 and switching is made by switch circuit 20 from I/O gate 9 to I/O gate spare register 22 when no coincidence occurs between the contents. Furthermore, signals of aOR, $\overline{anR}$-anR, $\overline{anR}$=1 and aOR, $\overline{aOR}$-anR, $\overline{anR}$=0 are produced by row buffer spare register 18 and a comparison is then made by parity tree 261 shown in FIG. 5 between those signals and the physical addresses of spare storage elements 291 and 292. When no coincidence occurs, row spare decoder 5 is selected by row buffer spare register 18 and spare storage element 291 or 292 corresponding to decoder 5 is selected by the outputs of row decoder 4.

From the above it will be understood that the column address checking and switching is the same as row address checking and switching except for the check on the I/O gate in the direction of row.

As described above, since the automatic restoration is made possible, the testing time can be shorten and the number of steps can be reduced, thus providing a highly reliable semiconductor device. The present invention is also adaptable to a PROM (programmable ROM).

According to the present invention, as described above, defective elements can be saved without the need for replacement of lines as in prior arts. Also, there are no influence from the outside and no influence on neighboring elements resulting from disconnection of fuses by current or disconnection by laser beam. Furthermore, the decoder itself can also be saved by the parity check. It is also possible to keep down the generation rate of defective elements in semiconductor manufacturing processes increased in complexity with an increase in integration density. In addition, since the defectiveness of a memory can be restored automatically, the semiconductor device of the present invention is adaptable to space equipment and safety equipment.

What is claimed is:

1. A semiconductor device comprising:
   main storage means for storing data;
   spare storage means disposed in association with said main storage means so as to serve as a redundancy circuit for replacing a defective element of said main storage means;
   temporary storage means disposed in association with said main storage means to store said data temporarily;
   comparing means for comparing the data stored in said main storage means with the data stored in said temporary storage means to output a comparison result; and
   switching means coupled to said main storage means and said spare storage means and responsive to the comparison result output from said comparing means for replacing the defective element of said main storage means with said spare storage means.

2. A semiconductor device according to claim 1, in which said comparing means comprises a first EXCLUSIVE OR circuit for receiving the data stored in said main storage means, a second EXCLUSIVE OR circuit for receiving the data stored in said temporary storage means, and a third EXCLUSIVE OR circuit for receiving outputs of said first and second EXCLUSIVE OR circuits.

3. A semiconductor device according to claim 1, further comprising a row decoder, a row spare decoder, and a row buffer spare register for replacing part of the row decoder with the row spare decoder, in response to the comparison result from said comparing means.

4. A semiconductor device according to claim 1, further comprising spare register means for storing the comparison result output from said comparing means.

5. A semiconductor device comprising:
   main storage means for storing data;
   temporary storage means disposed in association with said main storage means for storing the data temporarily;
   spare storage means disposed in association with said main storage means so as to serve as a redundancy circuit for replacing a defective element of said main storage means;
   address select means for selecting the address of said spare storage means; and
   comparing means for comparing the data stored in the address selected by said address select means and the data stored in said temporary storage means for providing a comparison output.

6. A semiconductor device according to claim 5, in which said address select means includes a row buffer spare register, a switch circuit, a row address spare register, and an I/O gate spare register.

7. A semiconductor device according to claim 5, in which said row buffer spare register includes means for generating an address of said spare storage means.

8. A semiconductor device according to claim 5, in which said comparing means comprises a first EXCLUSIVE OR circuit for receiving the data stored in said main storage means, a second EXCLUSIVE OR circuit for receiving the data stored in said temporary storage means, and a third EXCLUSIVE OR circuit for receiving outputs of said first and second EXCLUSIVE OR circuits.

* * * * *